(12) United States Patent
Casparian et al.

(10) Patent No.: US 8,711,011 B2
(45) Date of Patent: Apr. 29, 2014

(54) SYSTEMS AND METHODS FOR IMPLEMENTING PRESSURE SENSITIVE KEYBOARDS

(75) Inventors: Mark A. Casparian, Miami, FL (US); Frank C. Azor, Miami, FL (US)

(73) Assignee: Dell Products, LP, Round Rock, TX (US)

( * ) Notice: Subject to any disclaimer, the term of this patent is extended or adjusted under 35 U.S.C. 154(b) by 279 days.

(21) Appl. No.: 12/802,468

(22) Filed: Jun. 8, 2010

(65) Prior Publication Data

US 2010/0321301 A1 Dec. 23, 2010

Related U.S. Application Data

(63) Continuation-in-part of application No. 12/316,703, filed on Dec. 16, 2008.

(51) Int. Cl.
*H03K 17/94* (2006.01)

(52) U.S. Cl.
USPC .................................. 341/34; 341/20; 341/22

(58) Field of Classification Search
USPC .............................................. 341/20, 22, 34
See application file for complete search history.

(56) References Cited

U.S. PATENT DOCUMENTS

| | | | |
|---|---|---|---|
| 3,936,674 A | 2/1976 | Hughes | |
| 4,291,201 A * | 9/1981 | Johnson et al. | 379/368 |
| 4,302,011 A | 11/1981 | Pepper, Jr. | |
| 4,303,811 A * | 12/1981 | Parkinson | 200/5 A |
| 4,334,134 A | 6/1982 | Janda | |
| 4,449,024 A | 5/1984 | Stracener | |
| 4,527,250 A | 7/1985 | Galdun et al. | |
| 4,733,590 A * | 3/1988 | Watanabe | 84/720 |
| 4,896,069 A | 1/1990 | Rosenberg et al. | |
| 4,899,631 A | 2/1990 | Baker | |
| 4,977,298 A * | 12/1990 | Fujiyama | 200/5 A |
| 5,220,318 A * | 6/1993 | Staley | 341/34 |
| 5,252,798 A | 10/1993 | Kamada | |
| 5,285,037 A | 2/1994 | Baranski et al. | |
| 5,408,060 A | 4/1995 | Muurinen | |
| 5,434,566 A * | 7/1995 | Iwasa et al. | 341/34 |
| 5,450,078 A | 9/1995 | Silva et al. | |

(Continued)

OTHER PUBLICATIONS

Casparian et al., "Systems and Methods for Implementing Haptics for Pressure Sensitive Keyboards", U.S. Appl. No. 12/930,125, Office Action, Aug. 9, 2012; 16 pgs.

(Continued)

*Primary Examiner* — Tai T Nguyen
*Assistant Examiner* — Amine Benlagsir
(74) *Attorney, Agent, or Firm* — Egan, Peterman, Enders LLP.

(57) ABSTRACT

Systems and methods for implementing pressure sensitive keys to produce digital signals that emulate actuation of conventional "momentary on" digital keys of a conventional keyboard. The pressure sensitive keys may be implemented to generate an alternating open/short digital signal representative of the amount of pressure applied to a given key at any given time. The open/short digital signal may be supplied as a signal representative of applied key pressure to a legacy keyboard key matrix and controller or other processing device of an information handling system that is configured to measure keyboard input based on "momentary-on" digital signals.

32 Claims, 6 Drawing Sheets

(56) References Cited

U.S. PATENT DOCUMENTS

| | | | |
|---|---|---|---|
| 5,909,211 | A | 6/1999 | Combs et al. |
| 6,007,209 | A | 12/1999 | Pelka |
| 6,102,802 | A | 8/2000 | Armstrong |
| 6,135,886 | A | 10/2000 | Armstrong |
| 6,275,138 | B1 | 8/2001 | Maeda |
| 6,559,399 | B2 | 5/2003 | Hsu et al. |
| 6,608,271 | B2 | 8/2003 | Duarte |
| 6,684,166 | B2 | 1/2004 | Bellwood et al. |
| 6,747,867 | B2 | 6/2004 | Hsu |
| 6,758,615 | B2 | 7/2004 | Monney et al. |
| 6,860,612 | B2 | 3/2005 | Chiang et al. |
| 6,883,985 | B2 | 4/2005 | Roberson |
| 6,918,677 | B2 | 7/2005 | Shipman |
| 7,059,790 | B2 * | 6/2006 | Risheq .................. 400/491 |
| 7,106,305 | B2 | 9/2006 | Rosenberg |
| 7,123,241 | B2 | 10/2006 | Bathiche |
| 7,244,898 | B2 | 7/2007 | Kim |
| 7,256,768 | B2 | 8/2007 | Bathiche |
| 7,335,844 | B2 | 2/2008 | Lee et al. |
| 7,394,033 | B2 | 7/2008 | Kim |
| 7,655,901 | B2 | 2/2010 | Idzik et al. |
| 7,667,371 | B2 | 2/2010 | Sadler et al. |
| 7,688,310 | B2 | 3/2010 | Rosenberg |
| 7,741,979 | B2 | 6/2010 | Schlosser et al. |
| 7,772,987 | B2 | 8/2010 | Shows |
| 7,786,395 | B2 | 8/2010 | Ozias et al. |
| 8,159,461 | B2 | 4/2012 | Martin et al. |
| 8,217,892 | B2 | 7/2012 | Meadors |
| 8,224,391 | B2 | 7/2012 | Kim et al. |
| 8,307,222 | B2 | 11/2012 | Wang et al. |
| 8,411,029 | B2 | 4/2013 | Casparian et al. |
| 8,502,094 | B2 | 8/2013 | Chen |
| 2002/0084721 | A1 | 7/2002 | Walczak |
| 2003/0072595 | A1 | 4/2003 | Al-Safar |
| 2003/0210233 | A1 * | 11/2003 | Frulla ................... 345/168 |
| 2004/0027385 | A1 * | 2/2004 | Rekimoto et al. ......... 345/773 |
| 2004/0174200 | A1 | 9/2004 | McNutt |
| 2004/0183783 | A1 | 9/2004 | Rojas et al. |
| 2005/0057514 | A1 | 3/2005 | Bathiche |
| 2005/0057515 | A1 | 3/2005 | Bathiche |
| 2005/0073446 | A1 | 4/2005 | Lazaridis et al. |
| 2006/0022951 | A1 | 2/2006 | Hull |
| 2006/0148564 | A1 | 7/2006 | Herkelman |
| 2006/0277466 | A1 | 12/2006 | Anderson |
| 2007/0065215 | A1 | 3/2007 | Brown |
| 2007/0227256 | A1 | 10/2007 | Wright |
| 2007/0235307 | A1 | 10/2007 | Liao et al. |
| 2007/0285393 | A1 | 12/2007 | Ishakov |
| 2008/0092087 | A1 | 4/2008 | Brown et al. |
| 2008/0179172 | A1 | 7/2008 | Sellers |
| 2008/0251364 | A1 | 10/2008 | Takala et al. |
| 2009/0007758 | A1 | 1/2009 | Schlosser et al. |
| 2009/0079612 | A1 | 3/2009 | Parfitt |
| 2009/0127084 | A1 | 5/2009 | Ozias et al. |
| 2009/0140985 | A1 | 6/2009 | Liu |
| 2009/0178913 | A1 | 7/2009 | Peterson et al. |
| 2009/0189790 | A1 | 7/2009 | Peterson et al. |
| 2009/0189873 | A1 | 7/2009 | Peterson et al. |
| 2009/0207055 | A1 | 8/2009 | Aull et al. |
| 2010/0027854 | A1 | 2/2010 | Chatterjee et al. |
| 2010/0089735 | A1 | 4/2010 | Takeda et al. |
| 2010/0090813 | A1 | 4/2010 | Je et al. |
| 2010/0090814 | A1 | 4/2010 | Cybart et al. |
| 2010/0090957 | A1 | 4/2010 | Idzik et al. |
| 2010/0117809 | A1 | 5/2010 | Dai et al. |
| 2010/0182241 | A1 | 7/2010 | Rosenberg |
| 2010/0205803 | A1 | 8/2010 | Lipton et al. |
| 2010/0253552 | A1 | 10/2010 | Mendez et al. |
| 2010/0288607 | A1 | 11/2010 | Ozias et al. |
| 2010/0321301 | A1 * | 12/2010 | Casparian et al. .......... 345/168 |
| 2011/0102325 | A1 | 5/2011 | Sato et al. |
| 2011/0102340 | A1 * | 5/2011 | Martin et al. .......... 345/173 |
| 2012/0298491 | A1 | 11/2012 | Ozias et al. |
| 2013/0100028 | A1 | 4/2013 | Mahowald et al. |
| 2013/0178292 | A1 | 7/2013 | Casparian et al. |

OTHER PUBLICATIONS

Casparian et al., Keyboard With User Configurable Granularity Scales for Pressure Sensitive Keys, U.S. Appl. No. 12/316,703, Response, May 29, 2012; 15 pgs.

Texas Instruments, "MSP430 Capacitive Single-Touch Sensor Design Guide", Application report, SLAA379, Jan. 2008, 19 pgs.

Casparian et al., "Keyboard With User Configurable Granularity Scales for Pressure Sensitive Keys", U.S. Appl. No. 12/316,703, filed Dec. 16, 2008, 33 pgs.

Wang et al., "Flexible Cell Battery Systems and Methods for Powering Information Handling Systems", U.S. Appl. No. 12/586,676, filed Sep. 25, 2009, 34 pgs.

Cypress Semiconductor Corporation, Cypress Perform, "CY8C21634, CY8C21534, CY8C21434, CY8C21334, CY8C2123; PSoC® Mixed-Signal Array," Apr. 18, 2008, Document No. 38-12025 Rev. M, 43 pgs.

Logitech, "Logitech Gaming Keyboard G510", Printed from Internet Aug. 25, 2011, 3 pgs.

Saitek, "Saitek Pro Gamer Command Unit", Feb. 27, 2011, 7 pgs.

Saitek, "Saitek Pro Gamer Command Unit", Dec. 6, 2005, 41 pgs.

Casparian et al., "Systems and Methods for Implementing a Multi-Function Mode for Pressure Sensitive Sensors and Keyboards", Sep. 14, 2011, U.S. Appl. No. 13/232,707; 40 pgs.

Casparian et al., Keyboard With User Configurable Granularity Scales for Pressure Sensitive Keys, U.S. Appl. No. 12/316,703, Final Office Action, Aug. 2, 2012; 22 pgs.

Casparian et al., "Systems and Methods for Implementing Haptics for Pressure Sensitive Keyboards", U.S. Appl. No. 12/930,125, filed Dec. 29, 2010, 87 pgs.

Casparian et al., "Apparatus and Methods for Mounting Haptics Actuation Circuitry in Keyboards", U.S. Appl. No. 12/930,118, filed Dec. 29, 2010, 85 pgs.

Casparian et al., Keyboard With User Configurable Granularity Scales for Pressure Sensitive Keys, U.S. Appl. No. 12/316,703, Office Action, Feb. 27, 2012; 13 pgs.

Casparian et al., "Keyboard With User Configurable Granularity Scales for Pressure Sensitive Keys", U.S. Appl. No. 12/316,703, RCE and Amendment, Nov. 2, 2012, 19 pgs.

Casparian et al., "Systems and Methods for Implementing Haptics for Pressure Sensitive Keyboards", U.S. Appl. No. 12/930,125, Response to Office Action, Nov. 9, 2012; 23 pgs.

Casparian et al., "Systems and Methods for Implementing Haptics for Pressure Sensitive Keyboards", U.S. Appl. No. 12/930,125, Final Office Action, Jan. 2, 2013; 22 pgs.

Casparian et al., "Systems and Methods for Implementing Haptics for Pressure Sensitive Keyboards", U.S. Appl. No. 12/930,125, Amendment, Mar. 1, 2013, 26 pgs.

Casparian et al., "Systems and Methods for Implementing Haptics for Pressure Sensitive Keyboards", U.S. Appl. No. 12/930,125, Advisory Action, Apr. 3, 2013, 9 pgs.

Casparian et al., "Systems and Methods for Implementing a Multi-Function Mode for Pressure Sensitive Sensors and Keyboards", U.S. Appl. No. 13/232,707, filed Sep. 14, 2011, Office Action, Jul. 29, 2013, 16 pgs.

Casparian et al., "Systems and Methods for Implementing Pressure Sensitive Keyboards", U.S. Appl. No. 12/802,468, filed Jun. 8, 2010, RCE and Amendment, Aug. 12, 2013, 25 pgs.

Cherry Corporation, MX Series Key Switch, Obtained From Internet Aug. 12, 2013, 9 pgs.

Cherry Corporation, Keymodule MX, Obtained from Internet Jul. 25, 2013, 2 pgs.

The Keyboard Company, An Introduction to Cherry MX Mechanical Switches, Obtained from Internet Jul. 25, 2013, 7 pgs.

Zhang et al., Systems and Methods for Intelligent System Profile Unique Data Management:, U.S. Appl. No. 13/618,666, filed Sep. 14, 2012, 32 pgs.

Casparian et al., "Systems and Methods for Lighting Spring Loaded Mechanical Key Switches", U.S. Appl. No. 14/013,603, filed Aug. 29, 2013, 50 pgs.

(56) References Cited

OTHER PUBLICATIONS

Casparian et al., "Systems and Methods for Implementing Spring Loaded Mechanical Key Switches With Variable Displacement Sensing", U.S. Appl. No. 14/013,724, filed Aug. 29, 2013, 57 pgs.

Casparian et al., "Apparatus and Methods for Mounting Haptics Actuation Circuitry in Keyboards", U.S. Appl. No. 12/930,118, filed Dec. 29, 2010, Office Action, Oct. 4, 2013, 21 pgs.

Casparian et al., "Systems and Methods for Implementing Haptics for Pressure Sensitive Keyboards", U.S. Appl. No. 14/044,331, filed Oct. 2, 2013, Third Preliminary Amendment; Dec. 16, 2013, 23 pgs.

Casparian et al., "Apparatus and Methods for Mounting Haptics Actuation Circuitry in Keyboards", U.S. Appl. No. 12/930,118, filed Dec. 29, 2010, Amendment, Dec. 27, 2013, 19 pgs.

Casparian et al., "Systems and Methods for Implementing Haptics for Pressure Sensitive Keyboards"; U.S. Appl. No. 12/930,125, filed Dec. 29, 2010; Amendment After Allowance; Dec. 27, 2013, 23 pgs.

Casparian et al., "Systems and Methods for Implementing Haptics for Pressure Sensitive Keyboards", U.S. Appl. No. 14/044,331, filed Oct. 2, 2013, 87 pgs.

Casparian et al., "Systems and Methods for Implementing a Multi Function Mode for Pressure Sensitive Sensors and Keyboards", U.S. Appl. No. 13/232,707, filed Sep. 14, 2011, Amendment, Nov. 26, 2013, 19 pgs.

Casparian et al., "Systems and Methods for Implementing Haptics for Pressure Sensitive Keyboards", U.S. Appl. No. 14/044,331, filed Oct. 2, 2013, Preliminary Amendment; 22 pgs.

\* cited by examiner

SYSTEMS AND METHODS FOR IMPLEMENTING PRESSURE SENSITIVE KEYBOARDS

This patent application is a continuation-in-part of U.S. patent application Ser. No. 12/316,703, titled "Keyboard With User Configurable Granularity Scales For Pressure Sensitive Keys," by Mark A. Casparian, et al., filed on Dec. 16, 2008, the entire disclosure of which is incorporated herein by reference.

TECHNICAL FIELD

The techniques described herein relate to systems and methods for keyboards and, more particularly, for pressure sensitive keyboards.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many information handling systems use keyboards to obtain user input. Some prior keyboard solutions have provided pressure sensitive keys. The most common technique to provide pressure sensitive keys is to use variable resistance sensing techniques to provide an indication of the pressure applied by a user to a key. Variable capacitance sensing has also been utilized in some prior art products such as console gamepad controllers. While pressure sensitive buttons have been used before, improved techniques and control of pressure sensitive keys are still needed, particularly for gaming keyboards.

SUMMARY

Systems and methods are disclosed herein for implementing pressure sensitive keys to produce alternating digital open/short signals that emulate actuation of conventional "momentary on" digital keys. In one embodiment, the disclosed systems and methods may be implemented in an manner that allows a pressure sensitive keyboard to be implemented using variable capacitance, variable conductance, variable resistance or other suitable pressure sensitive measurement methodology to generate an alternating open/short digital signal representative of the amount of pressure applied to a given key at any given time. The open/short digital signal may be supplied as a signal representative of applied key pressure to a legacy keyboard controller or other processing device of an information handling system that is configured to measure keyboard input based on "momentary-on" signals. In one exemplary embodiment, the disclosed systems and methods may be advantageously implemented to provide a drop-in "replacement" keyboard for a standard-type momentary-on keyboard of an information handling system, e.g., portable information handling system such as a notebook computer that employs a conventional keyboard controller configured to receive momentary-on digital key signals and no analog keyboard signals. Other examples of portable information handling system include, but are not limited to, MP3 players, portable data assistants, cellular phones, tablet computers, etc.

The disclosed systems and methods may be implemented in one exemplary embodiment to achieve fast response time and/or for interfacing with a legacy keyboard controller. In this regard, pressure-sensing digital output circuitry (e.g., controller, microcontroller, or other processing device/s) may be implemented in a manner that supports any number of pressure sensitive keys, is compatible with a legacy keyboard controller and device drivers, and using little additional power. In one exemplary embodiment, falling edge-triggered digital interrupt inputs may be provided to a processing device of pressure-sensing digital output circuitry rather than feeding analog signals to an ADC. This advantageously allows improved response time to a user's input (e.g., finger pressure). Further, circuitry may be provided in another exemplary embodiment to interface any number of variable pressure sensitive keys to a legacy keyboard (e.g., 8 bit microcontroller, and 24 bit interface to a legacy keyboard matrix). Low power capability may be provided by using pressure-sensing digital output circuitry that processes code in an interrupt service routine (ISR) whenever an interrupt due to application of pressure on a pressure-sensitive key is sensed on any of the digital inputs of the circuitry, and then goes to sleep (i.e., low power state) while it continues to actively monitor its interrupt digital inputs for any other event. Thus, the pressure-sensing digital output circuitry only monitors trigger events, runs code when it detects them, and then goes back to sleep again until another trigger event is detected. This translates into ultra low power consumption for this embodiment, which is advantageous for "drop-in replacement" keyboard arrays that are capable of operating on an existing information handling system power supply.

Advantageously, the disclosed systems and methods may be implemented in another embodiment to provide a "drop-in replacement" of a current production keyboard array for an information handling system such as a notebook computer (e.g., for build-to-order specification, after market replacement in an existing previously built information handling system, updated production run, etc.) without requiring any mechanical, electrical, device driver or operating system (OS) changes to the existing information handling system. In such an embodiment, the pressure sensitive keys and the pressure-sensing digital output circuitry may be integrated into a replacement keyboard assembly that is mechanically and electrically compatible with the information handling system host equipment (e.g., including legacy keyboard controller), and using native OS keyboard drivers to operate the keyboard. The disclosed systems and methods may also advantageously be implemented in one embodiment to provide pressure-sensitive key capability for use with older games that only accept user key toggling because no special code patches are required to allow applications running on a host information handling system to understand keyboard input from the pressure sensitive keys of the disclosed keyboard systems, i.e., the keyboard input to the game is understood by the game as input from a legacy USB keyboard.

The disclosed pressure sensitive keyboard measurement methods and systems may be optionally implemented in one exemplary embodiment with user configurable pressure sensitive keys and techniques for controlling these keys for keyboards. In such an embodiment, user configuration information, including information for user configurable granularity scales, can be communicated from a host system to the keyboard and stored for later use by a keyboard controller or other processing device associated with the keyboard to control the operation of the pressure sensitive keys. Alternatively, such user configuration information may be employed by a software application operating on the host system that communicates with a keyboard controller to control the operation of the pressure sensitive keys. Either way, greater control of the pressure sensitive keys can be provided. This configurability is of particular use for applications such as where the keyboard is being used for gaming by a user running a gaming application on an information handling system. In particular, the user can configure the granularity scale for each pressure sensitive key so that each key can provide a desired gaming response. In addition, different configuration files can be stored so that a user can select and use different configurations for different games and/or different users can select and use different configurations based upon their personal preferences.

In one respect, disclosed herein is a keyboard system, including: one or more pressure sensitive keys configured to provide analog output signals corresponding to each given one of the pressure sensitive keys that is representative of pressure applied to the given key; and pressure sensing interface circuitry coupled to receive the analog output signal from each given one of the pressure sensitive keys, the pressure-sensing digital output circuitry being configured to provide a separate alternating open and short digital output signal based thereupon having a frequency that is representative of pressure applied to the corresponding given one of the pressure sensitive keys.

In another respect, disclosed herein is a method of accepting user input from a keyboard, including: providing one or more pressure sensitive keys; producing an analog output signal for each given one of the pressure sensitive keys when depressed by a user, the analog output signals being representative of pressure applied to the given pressure sensitive key by the user; and providing a separate alternating open and short (open/short) digital output signal based upon the analog output signal, the alternating open and short (open/short) digital output signals having a frequency that is representative of the pressure applied to the given pressure sensitive key by the user.

DESCRIPTION OF THE DRAWINGS

It is noted that the appended drawings illustrate only example embodiments of the techniques described herein and are, therefore, not to be considered limiting of its scope, for the invention may admit to other equally effective embodiments.

DETAILED DESCRIPTION OF THE INVENTION

Figure 1:
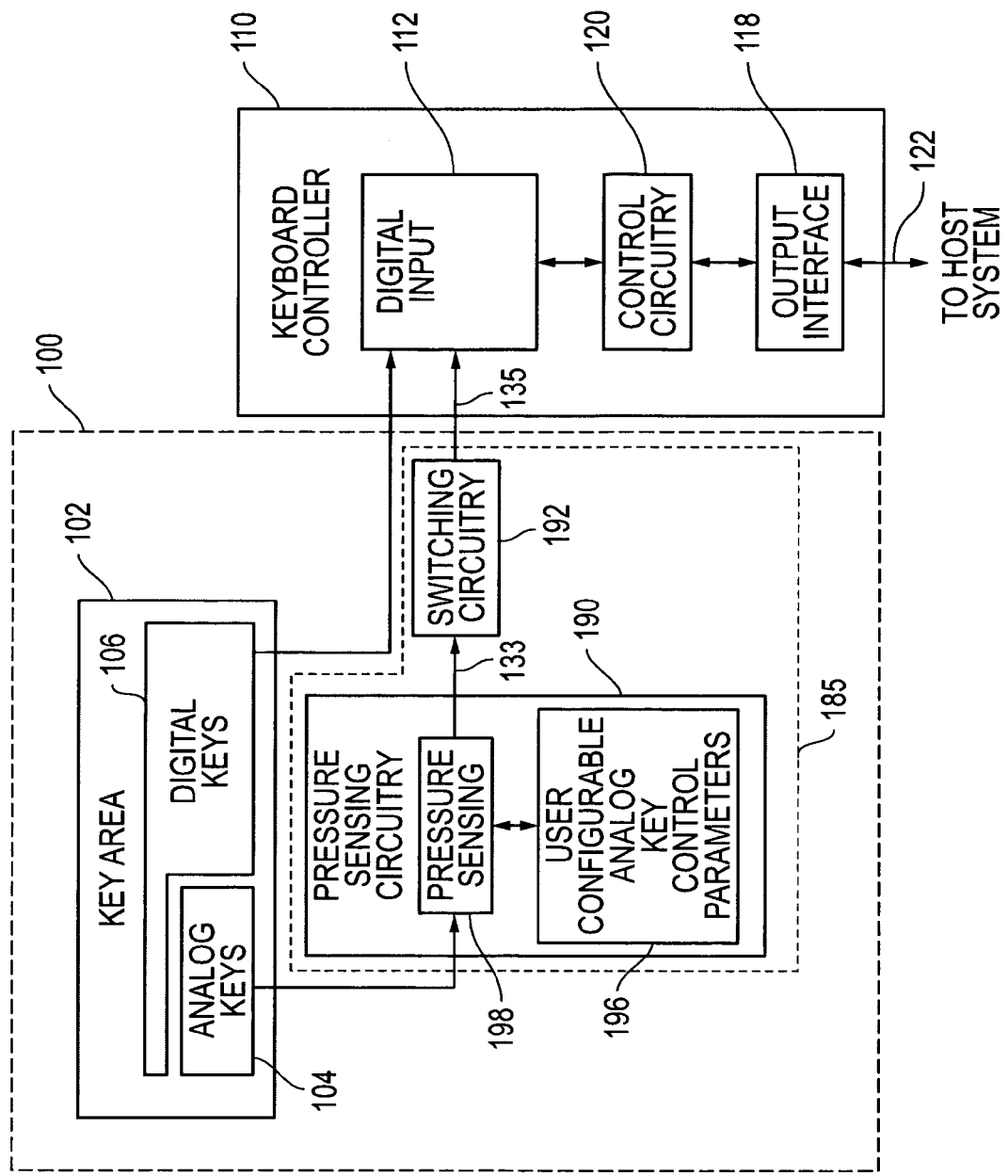
FIG. 1 is a block diagram illustrating a keyboard system according to one exemplary embodiment of the disclosed systems and methods.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a server computer system, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of non-volatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

As described herein, systems and methods are provided to implement pressure sensitive keys by producing a digital open/short signal that is representative of the amount of pressure applied to a given key at a given time. Conventional keyboards typically use rubber dome based keys that provide a momentary-on switch contact via a make-or-break contact with two layers of flex PCB (printed circuit board) with a raw exposed conductor pad on both layers that come into contact with one another upon a key press. In gaming applications, gainers typically use the W, A, S, and D keys for travel movements (forward, left, backward, right respectively); Q and E keys are typically used for strafing left and right respectively; and the spacebar key is used for jumping, although gaming keys are not restricted to these particular keys or functions. Rather than tapping a button a few times to make a gradual turn, or several rapid taps to make a sharp turn, it is more natural for a user to apply more pressure on the A or D keys to pull a tighter turn and/or turn with gradual or sharpness of turn desired proportionally to the amount of finger pressure applied to the respective keyboard key. Such capability is not only more intuitive, but allows the user easier granular control over game play input such as gradually turning/sharp turn, variable speed of travel movement (slow walk, spring), the rate of fire of a gun, variable degree of the amount of strafing to the left or right, but not limited to these examples. The advantageous solutions described herein enable variable capacitance measurement for implementing pressure sensitive keys and may be optionally implemented with user configurable granularity scales for these pressure sensitive keys to allow enhanced user control of how keys respond in a gaming application and/or any other desired application. Further information on the use of user configuration information, such as user configurable granularity scales, may be found in U.S. patent application Ser. No. 12/316,703 filed Dec. 16, 2008, which is incorporated herein by reference in its entirety.

There are many kinds of game genres. The features and ways to utilize variable pressure control vary from game to game or from genre to genre. For example, in a first person shooter (FPS) game, a particular variable pressure button may be used to control the speed of fire (single shot, multiple shots, faster multiple shots, machine gun rapid fire). For real-time strategy games, the variable finger pressure sensitivity of the key may mean something completely different. With a variety of game genres, and even within a particular genre, there are many game titles, where the user will want to save their keyboard's pressure sensitive button definitions in a profile for the game, even with the ability to categorize by game genre. It is also desirable to allow the user to configure how the pressure sensitive button should work. For example, the user may want the full range of gradual variable control. In another instance, the user may want this button to act like a momentary on/off switch button. In still another instance, the user may want the button to operate as four (4) possible positions (e.g., slow walk, fast walk, jog, sprint) depending on the amount of pressure applied by the finger. This user configuration information, and this user configurable granularity control in particular, as described below, can be communicated to and stored by the keyboard to provide the user this capability of configuring how the keyboard pressure sensitive keys will operate.

The keyboard embodiments described herein have from one to all of their keys controlled via pressure-sensitive sensors, such as variable conductance or variable capacitance sensors. As described in more detail below, an injection molded rubber dome sheet and flex circuitry can be used, in one exemplary embodiment, to accommodate both pressure sensitive keys and traditional momentary-on switch based keys. Using the disclosed systems and methods, a typical 24-bit digital pathway can be used from the keyboard array to the keyboard's microcontroller for any momentary-on keys. Typically, a keyboard microcontroller has three dedicated 8-bit digital input ports to take in this data, though it need not be limited to this. Current keyboards use rubber-dome momentary-on switches. The key cap has a rod or "chimney stack" on its bottom side. There is also a nipple or actuator on the bottom side of the rubber dome. As the user presses down on the key cap, the chimney stack presses down on the rubber dome, which in turn presses the nipple/actuator down on the flex circuitry beneath it. This pressing motion brings flex circuitry from one signal layer in direct contact with flex circuitry in a second signal layer. As a result, the two connections make contact, signaling to the microcontroller that the key has been pressed (the momentary-on signal). These rubber-dome momentary-on switches can be used for the non-pressure sensitive keys for the keyboards described herein.

In one exemplary embodiment, pressure sensitive keys may be configured to use rubber dome keys with conductive half-spheres or half-domes located on the underside of the rubber domes. In such an embodiment, the following principle may be employed: as the conductive sphere is pressed harder against a printed circuit board (PCB) or flexible PCB underneath it, the conductive sphere's surface area contact increases with pressure, thus increasing the capacitance of that contact in relationship with a nearby charged trace. The capacitance can be measured and sent to a keyboard controller as alternating open/short (alternating off/on) digital signals representative of the measured capacitance value without the need for further analog to digital signal conversion. The embodiments disclosed herein, therefore, can use analog-based variable-pressure keys and incorporate them with digitally-based momentary-on switches of typical keyboards to make a keyboard that supports both regular make/break keys and keys with variable forger pressure sensitivity, and at the same time that is compatible with legacy "momentary-on" measurement keyboard controllers such as are typically found in information handling systems such as notebook and desktop computers. This variable finger pressure sensitivity is particularly useful for gaming applications where there is a consistent need for more intuitive gaming interfaces.

For keyboards with both types of keys, signal inputs from both types of keys can be provided in one embodiment to a keyboard controller via a digital input block. For example, digital input can be provided directly to the keyboard controller by the typical keyboard array of momentary-on switches. These are the keys that operate as either switch on or off, essentially providing a digital 1 or 0 back to the microcontroller. Capacitive-sensing or other key pressure-sensing circuitry can also be present for providing alternating open/short digital input signals for the keyboard controller that are representative of the amount of pressure applied to a given pressure sensitive key at any given time. At the same time, the keyboard controller can also support any number of digitally based momentary-on switch based keys.

In the practice of the disclosed systems and methods, pressure sensing measurement circuitry such as capacitive-sensing digital output circuitry may be, for example, embedded or integrated within a keyboard controller, though it may also be located external to the microcontroller as well. In the latter case, a "drop-in" keyboard having both conventional momentary-on and pressure sensitive keys may be provided that has digital outputs for both types of keys that are compatible with a legacy digital keyboard controller. This capability may be advantageously employed, for example, to enable a build-to-order methodology in which either type of keyboard (i.e., traditional keyboard with only momentary-on keys or gaming keyboard with at least some pressure sensitive keys) may be selectively assembled to a common information handling system notebook chassis or common desktop keyboard chassis having a legacy keyboard controller, e.g., based on details of a specific customer order.

In one embodiment, for example, the pressure sensitive keys may be variable capacitance pads that are coupled to provide an analog signal input to capacitive-sensing digital output circuitry available from Texas Instruments of Dallas Tex. and having part number MSP430F2111. However, any other type of suitable capacitive-sensing digital output circuitry may be employed including, for example, any circuitry that uses RC discharge time to measure sensor capacitance as described in U.S. Pat. No. 3,936,674, which is incorporated herein by reference in its entirety. The capacitive-sensing digital output circuitry may be further optionally provided (integrally or separately) with signal switching circuitry, e.g., switch circuitry configured to interface with the legacy keyboard matrix array (e.g., 16 columns×8 rows) which require current sinking capability as well as to provide for capability of providing pressure sensitivity to all keys in a keyboard.

Examples of suitable signal switching circuitry for interfacing with a legacy keyboard controller include, but are not limited to, optoisolators or MOSFET switches that interface with the keyboard controller in a manner as will be described further herein. The momentary-on switch based keys input (when present) can be sent via, for example, a 24-bit digital path to the digital I/O of the keyboard controller, e.g., legacy 8051-based microcontroller available from sources such as Intel, Infineon Technologies, NXP, Silicon Laboratories, etc. The keyboard controller can also have an optional embedded I2C master/slave block used to talk to peripheral ICs (integrated circuits) for additional functionality. A serial EEPROM can also be optionally provided as part of the keyboard to communicate with the keyboard controller, for example, to provide the VID (vendor identification) and DID (device identification) information to the microcontroller via the I2C bus.

It is further noted that for an electronic lighting control embodiment where aspects of key lighting are implemented for the keyboard, a combination pulse width modulator (PWM) and LED (light emitting diode) driver integrated circuit can be used, such as part number MAX6964AEG available from Maxim. Such integrated circuits, for example, can receive commands from a host system, such as a personal computer, through the keyboard controller to drive RGB (red, green, blue) LEDs for keyboard lighting as instructed by the host system. The personal computer or host system, for example, can be configured to communicate with the keyboard controller through a USB connection, and the keyboard controller can be configured to convert these commands into a serial I2C stream provided to the PWM and LED driver integrated circuit which can in turn pulse width modulate the correct amount of light dimming and color to be provided for the keyboard lighting.

As described further below, a common injection-molded silicon rubber sheet can be used with built in rubber domes and a common flex circuitry to support both digital momentary-on switches and pressure sensitive sensors (e.g., variable resistance or variable capacitance). For variable capacitance sensing, as the user's finger applies pressure to the plastic keycap, it can be configured to press on the depressible rubber dome which has a conductive spherical shaped actuator on the bottom side. As the key cap is pressed, the conductive spherical shaped actuator comes into contact with one plate of a capacitor. An insulating layer is located above a second plate for the capacitor so that it is isolated from the first plate. Thus, the conductive actuator does not contact the second plate, and a capacitance develops between the two plates. As the user puts more pressure onto the keycap, more surface area of the conductive material from the conductive actuator will lie over first plate thereby increasing the capacitance between the two plates. Referring to the exemplary embodiment of FIG. 3B, to measure the capacitance change, plate two 230 may be connected to ground, and plate one 231 may have a trace connected to it that is routed to an I/O pin on pressure-sensing digital output circuitry 190 (e.g., TI MSP430 controller). The conductive material for the capacitive actuator may either be impregnated into the rubber dome material, or may be an external piece of material that is attached to the rubber dome via mechanical/snap-in means, via adhesive, or a hot fusing method. Other methods for providing a conductive and flexible actuator can also be used.

In operation of one embodiment of the keyboard, the amount of finger pressure applied by a user to a given key is sensed by the pressure sensing (e.g., variable capacitance sensing) digital output circuitry and is digitally provided to the keyboard controller via switching circuitry (e.g., optoisolator, MOSFET, etc.) that provides alternating open/short signal current pull down signals to the keyboard controller in a manner that emulates toggling of a conventional momentary off/on digital key. In an optional embodiment, configuration information provided by a user may be employed to adjust the operation of the pressure sensitive keys, e.g., via the pressure-sensing circuitry, other processing device, or software executing on a host system to which the keyboard is coupled. This user configuration information, for example, can optionally adjust the sensitivity and output levels generated by the keyboard controller based upon the pressure sensitive signals received with respect to the pressure sensitive keys as described in U.S. patent application Ser. No. 12/316,703 filed Dec. 16, 2008, which is incorporated herein by reference in its entirety. The keyboard controller can then in turn provide output signals to the host system that indicate pressure amounts. The host computer can then use these keyboard output signals with respect to particular software application functions being operated by the host computer. For gaming applications, such pressure sensitive functions may include the variability in the speed of travel (slow walk, trot, run, etc.), the amount of turning (slow, fast, etc.), the amount of strafing for a first-person-shoot game, the amount of braking for a vehicle race game, the degree of the rate of fire, the height of one's jump, and/or any other desired variable gaming feature.

Figure 2:
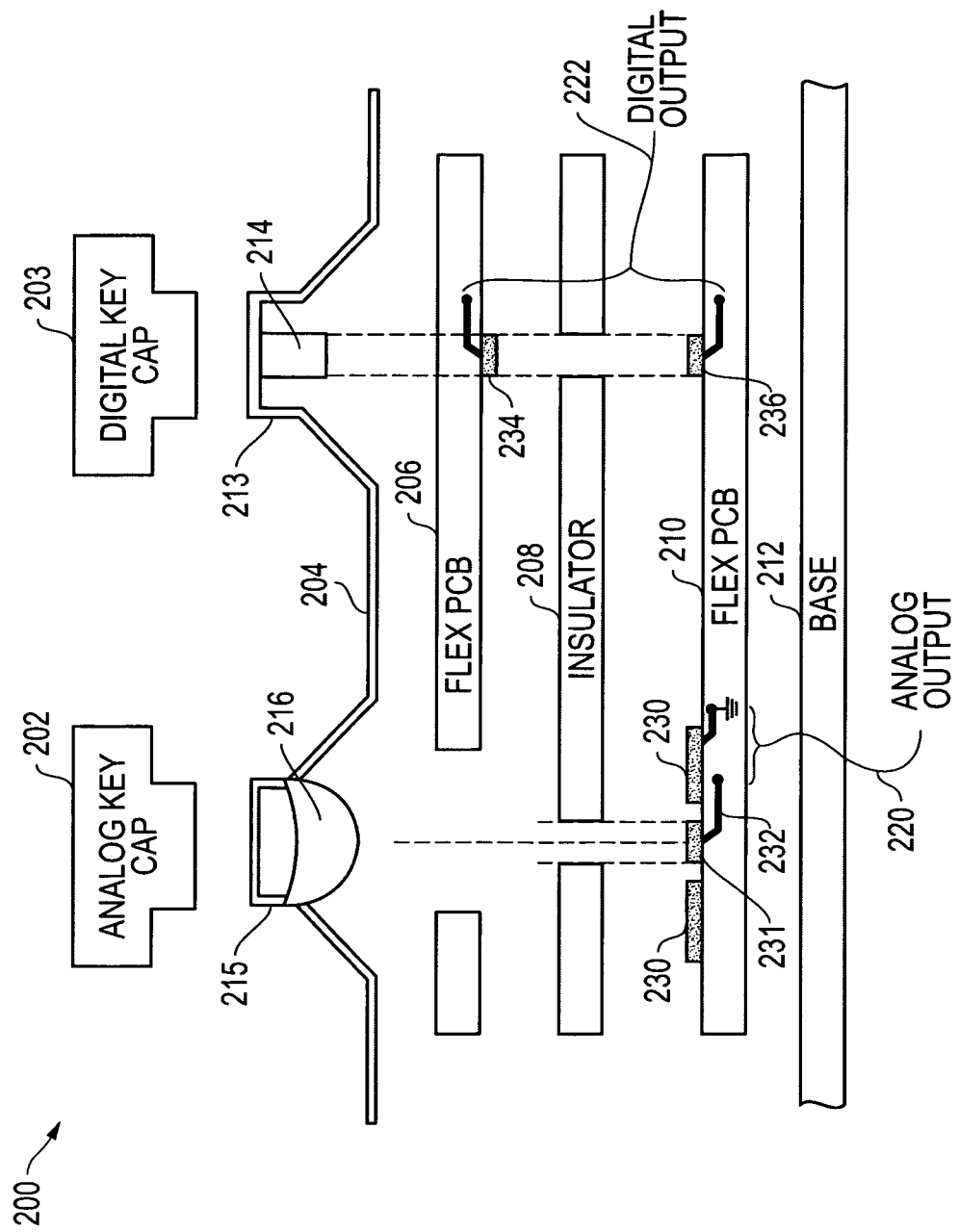
FIG. 2 is a diagram for a structure having both an analog key and a digital key according to one exemplary embodiment of the disclosed systems and methods.
Figure 3A:
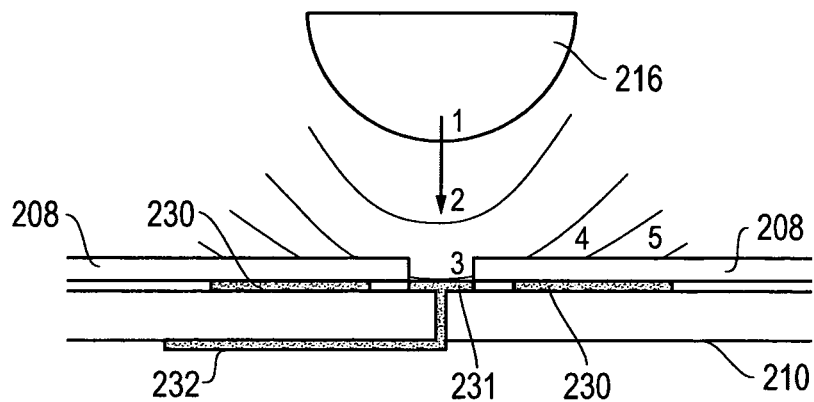
FIG. 3A is a diagram for different depressed states for a half-dome structure according to one exemplary embodiment of the disclosed systems and methods.
Figure 3B:
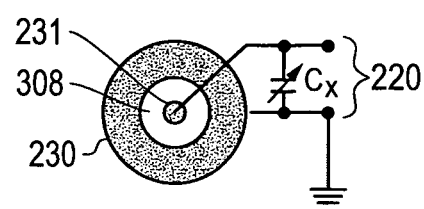
FIG. 3B is a diagram for a top view of the capacitive contacts for the half-dome structure according to one exemplary embodiment of the disclosed systems and methods.
Figure 4:
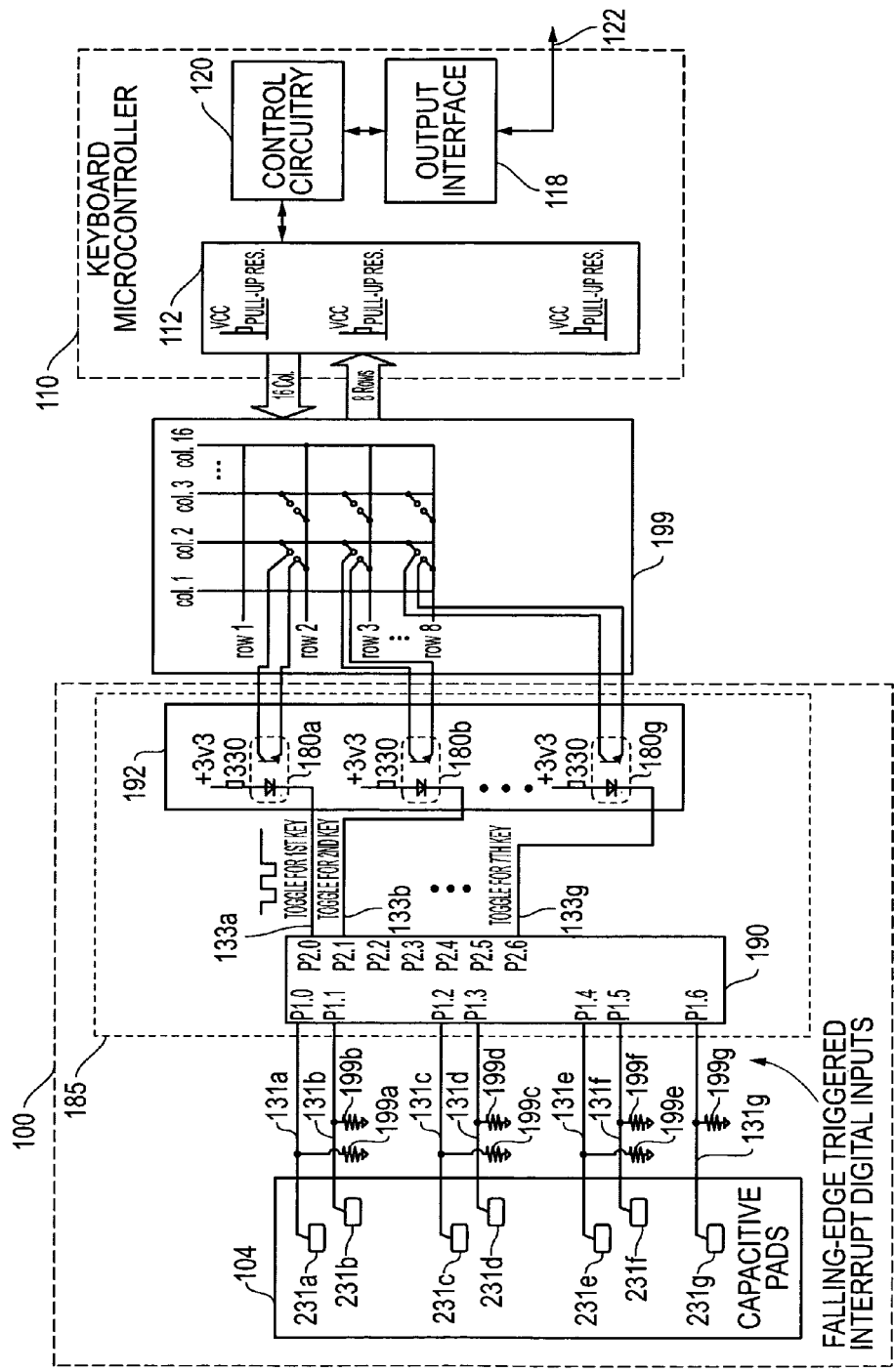
FIG. 4 is a block diagram illustrating a keyboard system according to one exemplary embodiment of the disclosed systems and methods.
Figure 5:
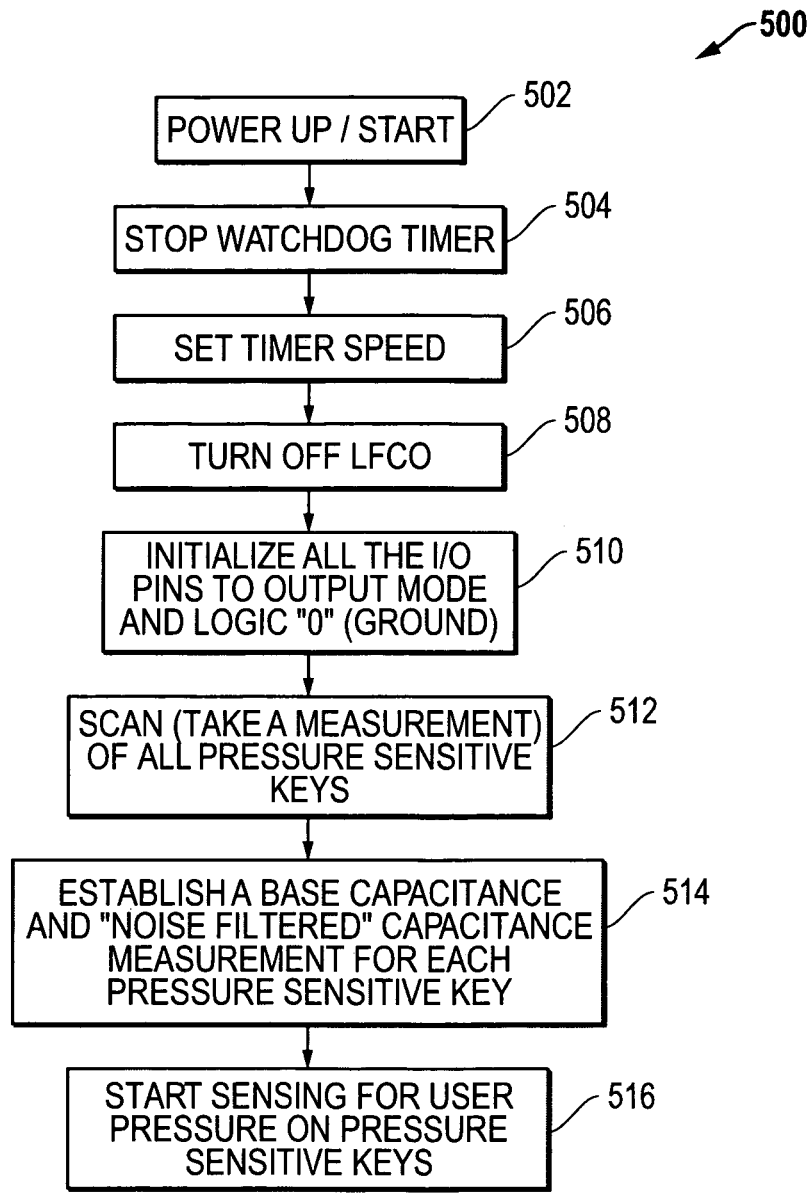
FIG. 5 illustrates methodology for initialization of pressure-sensing digital output circuitry according to one exemplary embodiment of the disclosed systems and methods.

The embodiments will now be described in more detail with respect to the drawings. FIG. 1 describes a system including variable keys. FIG. 2 shows an example structure for variable keys. FIGS. 3A and 3B provide examples for the operation of the pressure sensitive keys. FIG. 4 provides a circuit diagram for detection of capacitive sensitive keys and digital alternating open/short output to a keyboard controller. And FIG. 5 is a flow diagram illustrating initialization, detection of variable capacitance provided by pressure sensitive keys.

FIG. 1 is a block diagram for a keyboard system 100 including pressure sensitive analog keys 104 and digital keys 106. As depicted, a keyboard controller 110 is coupled through pressure sensing interface circuitry 185 to analog keys 104 of a key area 102 that is part of a keyboard device body. In this embodiment, the key area 102 includes both analog keys 104 and digital keys 106. The digital keys 106 represent keys that are momentary on keys that are detected as either depressed or not depressed. When a digital key is depressed, an output signal is sent to an I/O interface in the form of digital input block 112 within the keyboard controller 110. The analog keys 104 represent keys that are detected as being depressed by a variable amount or with a variable amount of pressure. When an analog key is depressed, an indication of the force or extent to which it is depressed is provided to pressure sensing interface circuitry 185 that in the illustrated embodiment includes pressure-sensing digital output circuitry 190 and switching circuitry 192. Pressure sensing interface circuitry 185 may be provided in one exemplary embodiment as part of the keyboard device body. However, digital input block 112 and one or more components of pressure sensing interface circuitry 185 may alternatively be integrated within a microcontroller that is operating as the keyboard controller 110 and/or as part of the host system to which the keyboard is connected, if desired. The digital input block 112 and one or more of the components of pressure sensing interface circuitry 185 could also be implemented with external circuitry, as well.

The pressure-sensing digital output circuitry 190 includes a pressure sensing block 198 that receives an analog signal representative of the pressure applied to each of analog keys 104 and then outputs an alternating high and low (high/low) digital output bit stream signal 133 having a frequency that is representative of this pressure being applied to each of analog keys 104 to a corresponding switching element of switching circuitry 192 (e.g., optoisolator, transistor such as MOSFETs, etc.). Each switching element of switching circuitry 192 responds to a digital signal 133 corresponding to a given analog key 104 by providing a toggled alternating open/short (off/on) digital signal 135 to a corresponding intersection point in the 16×8 key matrix which corresponds to that analog key 104 in a manner as described further herein. It will be understood that the particular embodiments illustrated herein are exemplary only, and that the components and function of pressure sensing interface circuitry 185 may be implemented using any one or more circuitry components suitable for receiving analog signals representative of key pressure from pressure sensitive keys 104 and providing corresponding alternating open/short digital output signals having a toggled frequency that is representative of key pressure from pressure sensitive keys 104 that is suitable, for example, for digital input to a legacy keyboard controller 110.

The control circuitry 120 within the keyboard controller 110 is coupled to receive on/off signals from the digital input block 112. The control circuitry 120 processes this key information and is connected to an output communication interface 118 so that this key information can be communicated to external devices, such as host components of an information handling system, through communication path 122. In addition, external devices can optionally communicate control and/or other configuration information to the keyboard controller though this same output communication interface 118 through communication path 122. Examples of possible information handling system components may be found described in U.S. patent application Ser. No. 12/586,676, filed Sep. 25, 2009, which is incorporated herein by reference in its entirety.

It is noted that the output communication interface 118 and communication path 122 can take a variety of forms. The communication path 122 can be a wired communication path or a wireless communication path, as desired. With respect to personal computer systems, such as desktop computers and laptop computers, the output communication interface 118 will often be a Bluetooth interface if a wireless interface is desired and will often be a USB (universal serial bus) interface if a wired interface is desired. However, it is again noted that any desired communication interface can be utilized. It is further noted that the keyboard controller 110 and the control circuitry 120 can be implemented as a microcontroller (e.g., legacy 8051-based microcontroller or custom microcontroller) that runs firmware stored on a memory device associated with the keyboard controller 110 and/or control circuitry 120.

It is also noted that the user configuration information 196 can be optionally stored in random access memory (RAM) or other memory storage that is associated with pressure sensing circuitry 190 (either internally or externally). Thus, the configurable analog key control parameters 196 can be stored, for example, on a RAM device in the keyboard or on the host system (e.g., on a hard drive) and can provide a wide variety of configurable parameters that can be adjusted by a user through an application programming interface (API) to a software utility application that, for example, has a graphic user interface (GUI) to allow a user to edit the parameters through the software utility. For example, the user configuration information may be stored, for example, in nonvolatile or volatile memory on board the keyboard system 100. Alternatively, the user configuration information may be stored on the host system or other device that is coupled by communication path 122 to output interface 118 off keyboard controller. Either way, single and/or multiple different user configuration files and/or multiple game (or application) configuration files may be stored allowing a user to select the applicable or desired keyboard configuration file depending on the game or application being used by the user and/or depending upon the particular user using the keyboard at the time in a manner as described in U.S. patent application Ser. No. 12/316,703 filed Dec. 16, 2008, which is incorporated herein by reference in its entirety.

FIG. 2 is a diagram for an embodiment 200 for key structures including an analog key and a digital key. In operation, depressing the analog key cap 202 causes a variable or analog output 220 to be provided by the keyboard, and depressing digital key cap 203 causes a digital or on/off output 222 to be provided by the keyboard. The analog keys provide a variable output, and the digital keys provide a momentary-on output. As depicted, the embodiment 200 has a layered structural approach that is similar to prior techniques except for the use of pressure sensitive keys, such as the capacitive key with a conductive and flexible half-dome structure 216 that is depicted in FIG. 2. This conductive and flexible half-dome structure 216 has advantageous operational benefits as described below.

In the layered structure, a base 212 represents the bottom of the layered structure and can be made of a material that can support the key structure, such as a hard plastic material. A flexible PCB (printed circuit board) 210 is then provided on top of the base 212. The PCB 210 includes circuit traces or connections that provide for electrical signals to be generated and communicated when keys are depressed. For example, circuit connection 236 is used to provide digital output 222, and circuit connection pads 230 and 231 are used to provide the analog output 220. The next layer is flexible insulator 208, such as a flexible PCB without circuit connections. The next layer is another flexible PCB 206 that can include circuit traces or connections that work in conjunction with the connections on PCB 210 to provide for electrical signals to be generated and communicated when keys are depressed. For example, circuit connection 234 is used to provide the digital output 222. A relatively thin flexible layer 204 can then be provided above PCB 206 and can be made from an injection molded silicon rubber sheet. This flexible layer 204 is configured to have a molded flexible rubber dome for each key. For example, flexible dome 215 is provided for analog key cap 202, and flexible dome 213 is provided for digital key cap 203.

For the digital key, an actuator 214 is also provided underneath the dome 213 that causes circuit trace 234 to be engaged with circuit trace 236 when the digital key cap 203 is depressed. When circuit trace 234 touches the circuit trace 236, a signal is now active indicating the key was pressed, causing a digital output 222 to be generated. This digital output 222 can be configured to provide a momentary-on indication of whether or not the key has been depressed. The digital key cap 203 can be made from hard plastic.

For the analog key, a conductive and flexible half-dome 216 is provided that flexes when depressed, as described in more detail below, to vary the capacitance associated between circuit pad 231 and circuit pad 230 when analog key cap 202 is depressed. Essentially pad 231 and pad 230 are the two plates of a capacitor. The variable capacitance between these two plates are measured from signal trace 232 by sending this trace to capacitance reading circuitry. As stated below, pad 230 can be coupled to ground. It is noted that the conductive and flexible half-dome 216 can be made, for example, from a conductive rubber material, that is conductive, flexible and capable of reforming its shape after being depressed and released. Prior art techniques have made this material from a carbon impregnated rubber.

As shown in more detail with respect to FIG. 3B described below, electrical pad 230 is shaped like a donut with an insulative material in the middle. Circuit trace 232 connects to the circuit pad 231 through a via within the insulative material with the conductive pad 231 being located in the middle of the insulative center of the donut area. Pad 230 may be attached to a signal trace, but the preferred method of embodiment has pad 230 being coupled to a given charge, such as being attached to ground. Due to insulator layer 208, the conductive half-dome 216 may only make contact to circuit pad 231 through the hole in the insulator 208.

As described further below, as the conductive and flexible half-dome 216 makes contact with circuit pad 231 and is deformed by pressure from the analog key cap 202, the capacitance between pad 231 and pad 230 increases. As more pressure is applied to the analog key cap 202, the half-dome 216 gradually deforms and flattens-out on top of the insulator, causing a larger conductive surface area to run parallel to pad 230. Effectively, there are two parallel plates provided by pads 231 and 230 with a fixed thickness insulator/dielectric between them. Pad 230 has a fixed surface area as it is printed onto the PCB 210. However, pad 231 has a variable surface area or is a variable sized parallel plate due to the action of half-dome 216 as it is depressed. As the surface area of pad 231 gradually increases due to action of half-dome 216 as greater force is applied to the analog key cap 202, the capacitance between plates 231 and 230 gradually increases as well. This variable capacitance can be sensed, measured and used as an indication of the pressure being applied to the analog key cap 202.

The advantage of the variable capacitance methodology over variable resistance is that the sensor is implemented on the PCB directly. For variable resistance methods, a sensor material is required per key that changes impedance when touched. This adds to the keyboard's BOM (build of materials) cost. It also reduces a source of variability of touch performance from PCB to PCB due to the variance of the impedance of printed traces or of the tolerance to passive resistors or other resistive materials used.

In one embodiment disclosed herein, pressure sensitive capacitive keys may be configured to generate a variable indication of how hard a key has been depressed. In this regard, FIG. 3A is a diagram for different depressed states for the conductive and flexible half-dome structure 216 of FIG. 2. In its initial state, the bottom edge of the half-dome structure 216 has a bottom edge position indicated by Line 1. As the key is depressed, the half-dome structure 216 will move through the gap in the Flex PCB layer 206 (see FIG. 2) and down towards insulator 208 and connection pad 231 on PCB 210. Line 2 represents the bottom edge of half-dome structure 216 when it has been depressed some distance. Line 3 represents the bottom edge of half-dome structure 216 when it has been depressed far enough to touch connection pad 231 through the gap in insulator 208. It is also noted that bottom edge will have flattened out slightly due to this contact, as shown with respect to Line 3. Line 4 shows that the bottom edge of half-dome structure 216 will continue to flatten as it is depressed. And Line 5 is a further indication of this flattening of the half-dome structure 216. As stated above, as the half-dome structure 216 is moved closer to connection pad 231, half-dome structure 216 will touch connection pad 231 and will then flatten out causing a larger surface area for electrical plate 231 relative to electrical plate 230. As the surface area of the plate 231 increases due to increased pressure on analog keycap 202, the capacitance between pad 231 and pad 230 correspondingly increases. This change in capacitance ($\Delta C$) can be used as an indicator of the pressure that has been used to depress the key associated with the half-dome structure 216. Connection pad 231 can be coupled to pressure sensing block 198 (of pressure-sensing digital output circuitry 190) that operates to sense and measure the electrical information provided from connection pad 231.

FIG. 3B is a diagram for a top view of the capacitive contact pads 230 and 231 for the half-dome structure. As depicted, an insulative material 308 sits between the contact pad 230 and the contact pad 231. As indicated above, the contact pad 230 can be coupled to ground. And the variable capacitance (Cx) between the pads 230 and 231 caused by the motion of the half-dome structure 216 can be used to provide the analog output 220. The variable capacitance (Cx) between pads 230 and 231 can be represented by a fixed capacitance component associated with the position of the pads 230 and 231 ($C_{fixed}$) and a varying capacitance component ($C_{variable}$) associated with the action of the half-dome 216, such that $Cx = C_{fixed} + C_{variable}$. The deforming of the half-dome structure 216 effectively increases the capacitor plate area associated with the pad 230, thereby effectively increasing the capacitance between pads 230 and 231. As stated above, the change in capacitance ($\Delta C$) caused by varying capacitance component ($C_{variable}$) due to the half-dome 216 can be then used as an indicator of the pressure that has been used to depress the key associated with the half-dome structure 216.

FIG. 4 illustrates one exemplary embodiment of a keyboard system 100 in which analog keys 104 are pressure sensitive capacitive keys as described in relation to FIGS. 2, 3A and 3B, having capacitive pads 231a-231g that are coupled to pressure-sensing digital output circuitry 190 that is implemented by a Texas Instruments 16-bit ultra-low power capacitive sensing microcontroller part number MSP430F2111. In this exemplary embodiment, pressure-sensing digital output circuitry 190 is specifically coupled for sensing and measuring capacitance for each key via a corresponding general purpose input output (GPIO) port P1.0 to P1.6 that incorporates a falling edge triggered digital interrupt. Although configured in this embodiment with one GPIO input provided per corresponding single capacitive pad 231, it is alternatively possible that multiple capacitive pads 231 may be coupled to a single GPIO input pin. However, for some embodiments, it may be found that less noise and improved performance may be achieved by coupling just one capacitive pad to each GPIO of pressure-sensing digital output circuitry 190.

In this exemplary embodiment, pressure-sensing digital output circuitry 190 employs RC capacitive measurement methodology with falling edge event driven interrupt performed on a per pin basis. Information on RC capacitive measurement may be found, for example, in U.S. Pat. No. 3,936,674, which is incorporated herein by reference in its entirety. Using this methodology, each capacitive pad 231a through 231g is charged and discharged via traces 131 one at a time, and the amount of time for the discharge of each corresponding pad 231 is measured using a timer operating at a high speed (e.g., timer operating at about 16 MHz or other suitable speed). Using this methodology, the higher the capacitance the longer the discharge time, thus providing a higher digital "count" output from the timer of digital output circuitry 190. In this regard, as the depressible half-sphere on the bottom side of the keycap of each capacitive pad 231 is depressed by applied finger pressure, the amount of surface area in contact increases, thus resulting in an increased capacitance on the pad. According to the capacitance relationship, as a plate surface area increases, its capacitance increases.

In one exemplary embodiment, pressure-sensing digital output circuitry 190 may be implemented by a TI MSP430F2111 microcontroller or other suitable circuitry that employs RC discharge time to measure the variable capacitance of each analog key 104 as follows. In this exemplary embodiment, each signal lines 131 acts as a single input/output (I/O) line between a given falling-edge triggered interrupt digital port P1.X of pressure-sensing digital output circuitry 190 and a corresponding given analog key 104. The capacitive plate of each analog key 104 is also coupled to ground through a resistor 199 (e.g., 6 MΩ or other resistor value selected to provide sufficiently slow RC discharge time to provide the desired measurement resolution for the given application). In this configuration, each signal line 131 is employed to charge, discharge and produce an interrupt when the voltage of the capacitor of analog key 104 crosses a low voltage threshold. For example, a given port P1.X of a given I/O line 131 may be set to output high to charge (e.g., with 500 nA charging current) the capacitive plate of a corresponding analog key 104 to near $V_{CC}$, and a free-running timer of the pressure-sensing digital output circuitry 190 read to mark the start time. Then the given port P1.X is set to input with negative-edge interrupt enabled and the resistor coupled to the capacitive plate of the corresponding analog key 104 discharges the capacitive plate of the analog key 104 to ground, during which pressure-sensing digital output circuitry 190 may go into low power mode to save power. When the voltage of the capacitive plate crosses an interrupt voltage $V_{IL}$ due to this discharge to ground, an interrupt is generated which causes the free-running timer to be read again and the elapsed time for discharge of the capacitive plate of the analog key 104 from near $V_{CC}$ to $V_{IL}$ is calculated. Pressure-sensing digital output circuitry 190 may then return to high power mode. The discharge timer count of the capacitive plate of each analog key 104 is proportional to its present capacitance, which depends on the amount of pressure currently applied to the key 104. In one exemplary implementation, multiple capacitor readings of a given analog key 104 may be averaged to filter out common mode noise, e.g., by using a charge cycle followed immediately by a discharge cycle and averaging the two values.

Still referring to the exemplary embodiment of FIG. 4, pressure-sensing digital output circuitry 190 provides a corresponding digital output 133 for each capacitive pad 231 and its input 131. Each digital output signal (P2.x) 133 corresponds to a respective capacitive pad input (P1.x) 131. In this embodiment, each digital output signal 133 is produced in an intermittent alternating high/low manner with a frequency that emulates the action of a user's finger toggling away at a conventional digital "momentary on" digital key at a variable speed that is based on the amount of pressure being applied to the corresponding pressure sensitive analog key 104. Thus, open/short mechanical user toggling control may be advantageously replaced by electrical control based on the key pressure applied by a user to provide a similar intermittent alternating high/low signal output without requiring a user to toggle the keys. It will be understood that although the exemplary microcontroller of pressure-sensing digital output circuitry 190 of FIG. 4 employs 8 digital falling-edge triggered interrupt inputs Port 1 (P1.x), and 8 digital outputs Ports 2 (P2.x), it is possible to select a different chip(s) to support more pressure sensitive keys.

In the exemplary embodiment of FIG. 4, keyboard system 100 is implemented to be interchangeable with a legacy USB keyboard for interconnection with standard 8 bit keyboard controller 110 via a standard 16×8 key matrix 199 with 16 columns×8 rows and native device drivers. However, it will be understood that one or more features of the disclosed systems and methods may be implemented in non-legacy or customized keyboard systems, and in any arrangement of one or more circuitry components as may be suitable for a given application.

In the exemplary embodiment of FIG. 4, legacy keyboard controller 110 has a standard keyboard matrix open/short input 199 provided for the 104 keys on a standard keyboard that is arranged as 16 columns by 8 rows, so that only 24 signals interface with the keyboard controller 110, rather than a signal line per key which would require over 100 signals to the keyboard controller 110. The keyboard controller 110 operates by initially selecting a single row and applying a logic level 1 to it. There are 16 keys in a column, with only one of those keys intersecting with the particular row that's at logic 1. To detect if a key is pressed in a row, each column is sequentially grounded. If a key is pressed, it shorts the column to the row, thus causing the row voltage to drop or go low. When the keyboard controller 110 detects the low voltage on the selected row, the pressed key can be determined by the column/row intersection that was electrically shorted. Once all columns have been queried in a single row, the keyboard controller 110 sequences to the next row, and so on until all rows have been queried, thus sampling the logic level for every key.

In summary, though a low voltage sense is used to detect a key press in normal keyboard microcontroller operation, an electrical short is required at each intersection of the keyboard key matrix 199 to indicate the press of a key. Thus, a direct alternating high/low digital output signal 133 from a microcontroller such as IT MSP430F2111 is incompatible with the inputs to such a legacy keyboard controller 110. However, in the illustrated embodiment, switching circuitry 192 may be provided as an interface between pressure-sensing digital circuitry 190 and legacy keyboard controller 110 for analog keys 104. The purpose of the switching circuitry 192 is to convert a high/low digital output stream into a stream of opens/shorts. For example, as shown in FIG. 4, a separate optoisolator 180 has been provided for each corresponding analog key switch location. Examples of such optoisolators include, but are not limited to, AVAGO 4N35 or ACPL-227 optocouplers available from Avago Technologies of San Jose, Calif.

In the exemplary embodiment of FIG. 4, each optoisolator 180 provides an electrical control over the make or break (short or open circuit) connection at a given column/row intersection location of keyboard matrix open/short input 198 for that particular key. This advantageously allows analog keys 104 to be implemented with a conventional keyboard matrix arrangement and legacy keyboard controller 110 (along with its firmware and device driver). Further, the implementation of this embodiment of switching circuitry 192 allows any key (and/or any number of keys) of a conventional keyboard matrix to be provided with pressure sensing capability.

FIG. 5 illustrates one exemplary embodiment of methodology 500 that may be employed for initialization of pressure-sensing digital output circuitry 190 of keyboard system 100 of FIG. 4. As shown, methodology 500 starts in step 502 with power up of an information handling system to which keyboard system 100 is coupled. The watchdog timer is stopped in step 504, and timer speed (e.g., digitally controlled crystal oscillator speed) is set in step 506 (e.g., to 16 MHz for TI MSP430F2111 microcontroller). Note that the faster the Timer's clock (e.g., DCO) is running, the more accurate the timing measurement of the RC discharge. Next, in optional step 508, any embedded low frequency crystal oscillator when present (e.g., such as is the case with the TI MSP430F2111) is turned off because the I/O pins for this oscillator can also function as I/O pins for additional capacitive pads supporting negative edge triggered interrupts. In such a case these oscillator pins may be optionally used as I/O pins to keep the package size (and pin out count) of the microcontroller as small as possible. Further, since there is no need for any additional clocks, any on-board low speed clock may be disabled in order to reduce power consumption and eliminate an unnecessary source of electrical noise. In step 510, all I/O pins of pressure-sensing digital output circuitry 190 are initialized to output mode and logic "0" (ground). Then in step 512, all analog pressure sensitive keys 104 are scanned, one at a time in a sequential or round-robin fashion, by measuring the voltage of each analog key 104 while all other analog keys are grounded. It does this by operating as such:

1. The I/O pin is set to output high. A Timer is read to mark the start time.
2. The I/O pin is set to input mode with negative edge interrupt enabled. The resistor then discharges the capacitive pad. The TI MSP430 microcontroller goes into low power mode for reduced power consumption, however, it's still able to monitor the interrupt enabled input I/O pins.
3. When the voltage of the sensor crosses the low level voltage threshold, an interrupt is generated.
4. The interrupt service routine (ISR) reads the Timer and calculates the time to discharge to the low voltage threshold level. This is referred to as a "count" value. The MSP430 exits low power mode and continues operation.

In one embodiment, upon host boot-up, a measurement of each of the analog keys may be performed sequentially ("scanning process") as labeled in step 512. This scanning process may be performed multiple times (e.g., 100 times) in order to allow the master clock and PCB conditions to stabilize.

Though not required, for some applications it may be advisable to provide additional filtering of the "count" measurement to remove any residual noise and further increase sensitivity of the capacitive pads as capacitive pad measurements are often noisy due to a number of factors such as temperature, humidity, voltage drift, component tolerances and 50/60 Hz mains. In step 514, a base capacitance is established and tracked, as the base capacitance of the capacitive pad can change due to environmental conditions such as temperature, humidity, voltage drift and/or component tolerances. Note that this is a slow type of change as changes occur in minutes, not microseconds. A baseline capacitance is established as the capacitance of each pad during the open state (when no finger is pressing on the key). As any of the above mentioned environmental factors changes, the base capacitance for each pad is updated and stored. If a decrease in capacitance is detected, the software must adjust the base capacitance rapidly since this is not a function of the sensor excitation. We can do this be re-averaging with the current count result. If an increase in capacitance is detected, the base capacitance may be adjusted very slowly as this may be due to a finger hovering over a key, and not because of an environmental drift effect. For example, the base capacitance may be adjusted by 1 with each measurement, but only if no keys are pressed. Additionally, an optional low pass filter (e.g., implemented in firmware/software or otherwise), may also help to eliminate the presence of any 50/60 Hz main-power noise that may coupled onto the capacitive pads. For example, in one exemplary embodiment, the low pass noise filter may be implemented as a software based IIR (infinite impulse response) filter, or essentially as a DC tracking filter.

Finally, in step 516, sensing for user pressure on each of analog keys 104 is started. The endless loop of this sensing process is described further below in relation to FIG. 6.

Figure 6:
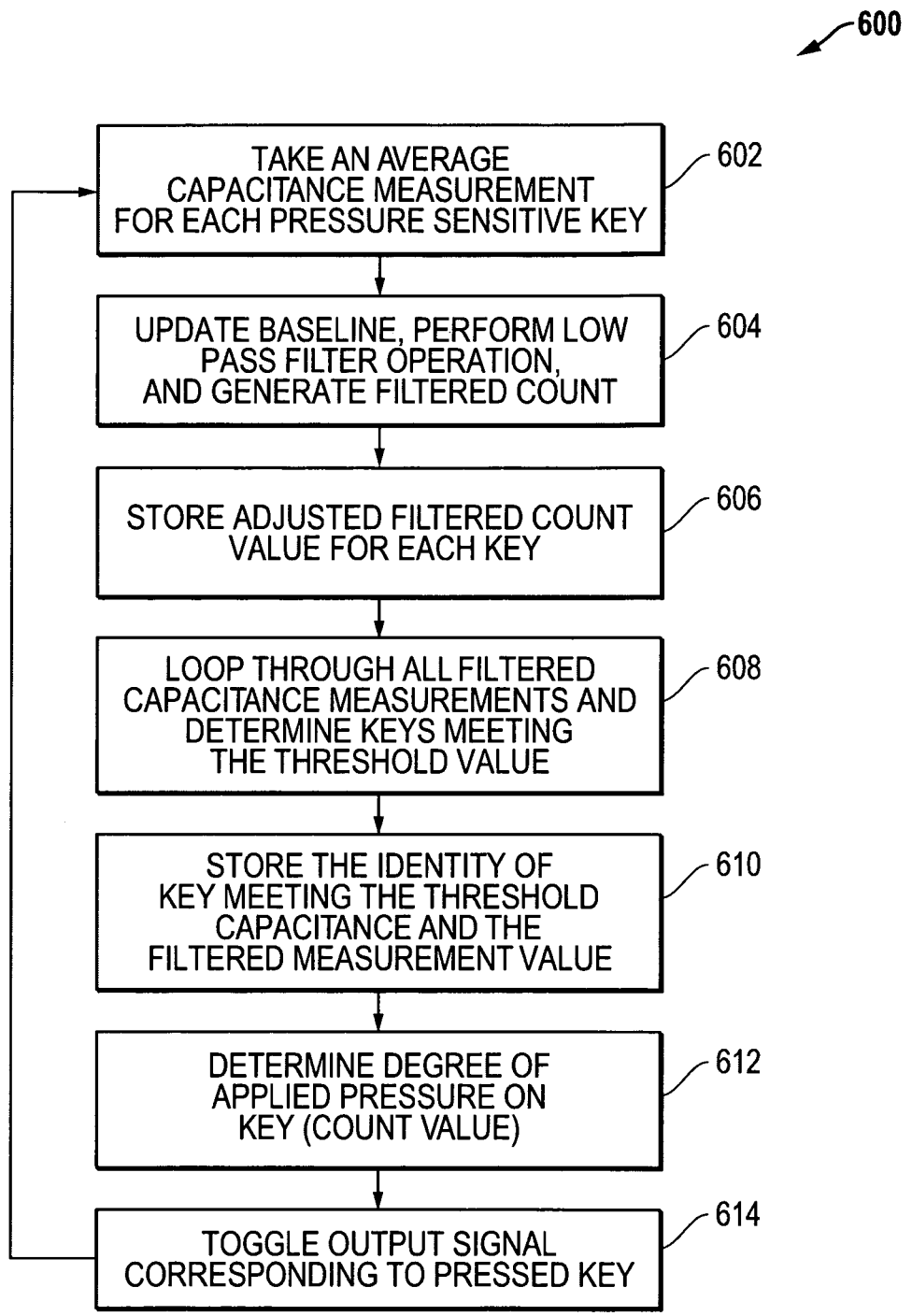
FIG. 6 illustrates methodology for sensing pressure applied to keys and producing a toggled digital signal representative thereof according to one exemplary embodiment of the disclosed systems and methods.

FIG. 6 illustrates methodology 600 for sensing, in real time, pressure applied to analog keys 104, and producing a toggled (alternating open/short) digital signal 133 representative thereof. FIG. 6 starts in step 602 by taking an averaged capacitance measurement for each pressure sensitive key 104 from signals 131 based on timer counts in a round robin manner as previously described. This may be done by actually taking multiple (e.g., two) measurements at a given pad. If these multiple measurements are conducted in quick succession, the average behaves like a differential measurement, thus helping filter out common-mode noise. Next, in step 604, the baseline count may be evaluated and updated per pad, as per the rules described above, and run through the low pass filter to generate a filtered count output (also called the adjusted capacitance measurement). In step 606, the present adjusted capacitance measurement value for each key 104 is then stored, e.g., in memory of pressure-sensing digital output circuitry 190. Next, in step 608, all the stored present adjusted capacitance values are examined to determine key(s) 104 having a present value of adjusted capacitance that exceeds a pre-determined adjusted capacitance threshold (this is the currently pressed key(s) 104). Then in step 610 the present identity (e.g., key number) of each of the key(s) 104 meeting the threshold adjusted capacitance value is stored along with corresponding present capacitance value(s). Alternatively, the key 104 being currently pressed may be identified as the key 104 having the largest adjusted capacitance measurement of all keys 104 in the current round robin cycle, i.e., rather than using the adjusted capacitance threshold value to determine pressed keys.

Example code for executing steps 602-610 is as follows:

```
/* TAKE MEASUREMENT ON 4 CAPACITIVE PADS */
int scan_keys(void)
{
    int i;
    int margin;
    for (i = 0; i < NUM_LINES; i++)
    {
        /* take pad measurement and establish */
            margin = measure_key_capacitance(i) - key_line[i].base_capacitance;
        /* convert measurement to filtered value using a single pole IIR low pass
            filter */
            key_line[i].filtered += (margin - (key_line[i].filtered >> 4));
        /* KEY_LINE[I].FILTERED IS OUR "COUNT" WE WANT TO USE */
    }
    return 0;
```

```
}
/* FIGURE OUT WHICH KEY LINE IS PRESSED ON (IF ANY) */
int find_finger_position(void)
{
    int i;
    int min;
    int max;
    int max_pos;
    /* Find the minimum and maximum responses for all the 4 key lines */
    min = 32767;
    max = -32768;
    max_pos = -1;
    for (i = 0; i < NUM_LINES; i++)
    {
            if (key_line[i].filtered < min)
                min = key_line[i].filtered;
            if (key_line[i].filtered > max)
            {
                max = key_line[i].filtered;
                max_pos = i;
            }
    }
    /* If the maximum response isn't that big, there is no finger present. */
    if (max < 200)
    {
        P1OUT &= 0xCF; /* no key pressed = "00" (P1.5, P1.4) */
        P1DIR |= 0x30;
        return 0;
    }
    /*P1.5, P1.4 are the 2 bit output pins*/
    /* TRUTH TABLE BELOW FOR KEY PRESS */
    /* P1.5 P1.4
            0  0   NO KEY IS PRESSED
            1  0   P1.0 IS PRESSED
            1  1   P1.2 IS PRESSED
            0  1   P1.3 IS PRESSED
    */
    if (max_pos == 0)
    {
        P1OUT |= 0x20; /* P1.0 IS PRESSED = "10" */
        P1OUT &= 0xEF;
        P1DIR |= 0x30;
        return max;
    }
    if (max_pos == 2)
    {
        P1OUT |= 0x30; /* P1.2 IS PRESSED = "11" */
        P1DIR |= 0x30;
        return max;
    }
    if (max_pos == 3)
    {
        P1OUT &= 0xDF; /* P1.3 IS PRESSED = "01" */
        P1OUT |= 0x10;
        P1DIR |= 0x30;
        return max;
    }
    if (max_pos == 1)
    {
        P1OUT &= 0xCF; /* otherwise = "00" */
        P1DIR |= 0x30;
        return 0;
    }
    else
    {
        P1OUT &= 0xCF; /* otherwise = "00" */
        P1DIR |= 0x30;
        return 0;
    }
}
int pressed_key_pressure = 0;
void main(void)
{
.
.
.
/* INITIALIZE ALL PADS TO BE SCANNED TO GROUND */
    for (i = 0; i < NUM_LINES; i++)
            init_key(&key_line[i], &key_line_config[i]);
    TACTL = TASSEL_2 | MC_2; // | ID_3;
```

```
/* Scan the keys 100 times, allowing plenty of time for the MCLK and board
conditions to stablise */
for (i = 0; i < 100; i++)
        scan_keys( );
/* Establish base capacitance and filtered "count" per active pad */
for (i = 0; i < NUM_LINES; i++)
{
        key_line[i].base_capacitance = key_line[i].filtered >> 4;
        key_line[i].filtered = 0;
}
for (;;)
{
        scan_keys( );
        if ((pressed_key_pressure = find_finger_position( )) > 0)
        {
                /* There is a finger on the pad */
                send_to_host(pressed_key_pressure);
        }
        else
        {
                /* There is no finger on the pad */
                send_to_host(0);
        }
    }
}
```

Still referring to FIG. 6, the degree of applied pressure to a presently-pressed key is next determined, e.g., in a binning operation by comparing the filtered count value to a predetermined scale of counts per resolution in step 612 based on the stored adjusted capacitance value (or filtered count value) of step 610. Then, in step 614, a low active output 133 of pressure-sensing digital output circuitry 190 is toggled that corresponds to the identity of the presently-pressed key (e.g., output P2.1 is toggled for corresponding input P1.1). This toggled signal mimics or emulates the action of a user repeatedly pressing a conventional digital key 106 for a number of times that is proportional or otherwise relative to the strength of the desired input (i.e. greater pressure on analog key 104 corresponds to more rapid user repeat rate on digital key 106).

For example, in one exemplary embodiment, four levels of different toggle output resolution (i.e., alternating toggle rate frequency) may be pre-defined for measured timer counts of a pressed key 104. As an example, a maximum toggle rate may be defined to correspond to a maximum timer count level of 200 with four decreasingly lower toggle rate levels defined for timer counts of 180, 160, 140 and 120, and anything below 120 being disregarded as noise, e.g., toggle rate frequency of 20 times/second for timer count range of 180-200, toggle rate frequency of 16 times/second for timer count range of 160-180, toggle rate frequency of 10 times/second for timer count range of 140-160, toggle rate frequency of 8 times/second for timer count range of 120-140, and no toggling for timer count range of less than 120. It will be understood that this particular number of timer count levels and corresponding timer count values is exemplary only and that greater or fewer numbers of timer count levels and/or different timer count values may be employed in other embodiments. Following is example code for the four timer count level embodiment described above:

```
if (count > 180)
    for (num_toggles = 20; num_toggles >0 ; num_toggles--)
        {
            P2OUT ^= 0x02;    /*Toggle P2.1 low 10 times in
            1 sec */
            /* loop provides delay of 0.05 sec/.000017922 sec = 2789
            loops */
            for (loop=2789; loop>0; loop - -);
        }
else if ((count > 160) && (count <= 180))
    for (num_toggles=16; num_toggles>0; num_toggles - -)
        {
            P2OUT ^= 0x02;    /*Toggle P2.1 low 8 times in
            1 sec */
            /* loop provides delay of 0.0625 sec/.000017922 sec =
            3487 loops */
            for (loop=3487; loop>0; loop - -);
        }
else if ((count > 140) && (count <= 160))
    for (num_toggles=10; num_toggles>0; num_toggles - -)
        {
            P2OUT ^= 0x02;    /*Toggle P2.1 low 5 times in
            1 sec */
            /* loop provides delay of 0.1 sec/.000017922 sec =
            5579 loops */
            for (loop=5579; loop>0; loop - -);
        }
else if ((count > 120) && (count <= 140))
    for (num_toggles=4; num_toggles>0; num_toggles - -)
        {
            P2OUT ^= 0x02;    /*Toggle P2.1 low 2 times
            in 1 sec */
            /*loop provides delay of 0.25 sec/.000017922 sec =
            13949 loops */
            for (loop=13949; loop>0; loop - -);
        }
else
        {
            / * DO NOTHING. KEY IS NOT PRESSED ON */
        }
```

It will be understood that step 610 described above is optional and only may be employed when the number of analog keys 104 exceeds the number of output lines 133. Alternatively, methodology 600 may: pause the round robin measurements whenever a pressed key 104 is identified as exceeding the threshold adjusted capacitance value, determine the degree of applied pressure to pressed key 104 based on its capacitance, and toggle the output signal of the pressed key 104. The count value of the identified pressed key 104 may be monitored and reevaluated for as long as it remains pressed by reevaluating the pressed key's timer count by rerunning it through the binning operation to see if the pressure is changed, and outputting an updated digital bit stream signal 133 based thereon. Once it is determined that the identified key 104 is no longer being pressed, then the round robin procedure may resume to the next key 104 and inquire of its count value for this round robin cycle. Either way, the round robin cycle continues for as long as the keyboard system 100 is powered up. After shut down, the pressure-sensing digital output circuitry 190 may be reset on next power up, all keys reinitialized (e.g., per FIG. 5), and the round robin key capacitance measurement routine initialized again.

It will be understood that one or more of the tasks, functions, or methodologies described herein may be implemented, for example, as firmware or other computer program of instructions embodied in a tangible computer readable medium that is executed by a CPU, microcontroller, or other suitable processing device.

Further modifications and alternative embodiments of the techniques described herein will be apparent to those skilled in the art in view of this description. It will be recognized, therefore, that the techniques described herein are not limited by these example arrangements. Accordingly, this description is to be construed as illustrative only and is for the purpose of teaching those skilled in the art the manner of carrying out the techniques described herein. It is to be understood that the forms of the techniques described herein shown and described are to be taken as the presently preferred embodiments. Various changes may be made in the implementations and architectures. For example, equivalent elements may be substituted for those illustrated and described herein and certain features of the techniques described herein may be utilized independently of the use of other features, all as would be apparent to one skilled in the art after having the benefit of this description of the techniques.

The invention claimed is:

1. A keyboard system, comprising:
one or more pressure sensitive keys configured to provide analog output signals corresponding to each given one of the pressure sensitive keys that is representative of the given amount of pressure being currently applied to the given key; and
pressure sensing interface circuitry coupled to receive the analog output signal from each given one of the pressure sensitive keys, the pressure-sensing interface circuitry being configured to provide a corresponding separate toggled alternating open and short on/off digital output signal based thereupon having a frequency alternating between on and off that is representative of the given amount of pressure being currently applied to the corresponding given one of the pressure sensitive keys by:
sensing in real time pressure applied to each given one of the pressure sensitive keys,
identifying a pressure sensitive key presently being pressed,
determining a degree of pressure being applied to the presently-pressed pressure sensitive key,
providing a separate toggled alternating open and short on/off digital output signal by toggling a digital output signal corresponding to the identity of the presently-pressed pressure sensitive key to emulate the action of a user's finger repeatedly pressing a conventional digital key with a rate that is relative to the pressure being applied to the presently-pressed pressure sensitive key, and
monitoring and reevaluating the degree of pressure being applied to the presently-pressed pressure sensitive key and outputting an updated toggled digital output signal for as long as the presently-pressed pressure sensitive key remains pressed.

2. The keyboard system of claim 1, wherein the pressure sensing interface circuitry further comprises:
pressure-sensing digital output circuitry coupled to receive the analog output signal from each given one of the pressure sensitive keys, the pressure-sensing digital output circuitry being configured to provide a separate alternating high and low (high/low) digital output signal based thereupon having a frequency alternating between high and low that is representative of pressure applied to each given corresponding one of the pressure sensitive keys; and
switching circuitry configured to receive each of the alternating high/low digital output signals and to provide the separate alternating open/short on/off digital output signal having a frequency alternating between on and off that is representative of pressure applied to each corresponding given one of the pressure sensitive keys.

3. The keyboard system of claim 1, wherein the pressure sensing interface circuitry includes falling edge-triggered digital interrupt inputs coupled to receive the analog output signals from each given one of the pressure sensitive keys.

4. The keyboard system of claim 1, wherein the pressure sensing interface circuitry is further configured for coupling to provide the separate alternating open/short on/off digital output signal corresponding to each given pressure sensitive key being currently pressed to a respective column/row intersection of a legacy keyboard key matrix that corresponds to the given pressure sensitive key being currently pressed, the legacy keyboard matrix being operably coupled to a legacy keyboard controller having no analog input circuitry.

5. The keyboard system of claim 4, further comprising a keyboard device body that includes the pressure sensing interface circuitry; wherein the keyboard device body is configured to be mechanically coupled as a drop-in keyboard to an information handling system chassis that includes the legacy keyboard controller.

6. The keyboard system of claim 5, wherein the information handling system is a notebook computer.

7. The keyboard system of claim 4, wherein the pressure sensing interface circuitry further comprises an integrated circuit including a microcontroller, the microcontroller having falling edge-triggered digital interrupt inputs for receiving the pressure sensitive analog signals from the pressure sensitive keys; wherein the legacy keyboard controller further comprises an I/O interface that interfaces with the legacy keyboard key matrix; and wherein each column/row intersection of the legacy keyboard key matrix accommodates an open or short of column/row signals corresponding to a given respective pressure sensitive key being currently pressed by receiving the alternating open/short digital output signal signals from the pressure sensing interface circuitry that corresponds to the given pressure sensitive key being currently pressed.

8. The keyboard system of claim 1, wherein each of the plurality of pressure sensitive keys is further configured to produce a variable capacitance analog signal when depressed by a user.

9. The keyboard system of claim 8, wherein each of the plurality of pressure sensitive keys further comprises a flexible and conductive half-dome structure positioned underneath a keycap.

10. The keyboard system of claim 8, wherein the pressure sensing interface circuitry is further configured to generate a count associated with the capacitance measurement of each given key, the count being utilized to represent pressure applied to the given pressure sensitive key; and to produce the separate alternating open/short digital output signal based upon the generated count having a frequency alternating between on and off that is representative of pressure applied to the corresponding given one of the pressure sensitive keys.

11. The keyboard system of claim 8, where each of the plurality of pressure sensitive keys further comprises a capacitive plate and is further configured to produce a variable capacitance analog signal when depressed by a user; and where the pressure sensing interface circuitry is further configured to determine a degree of pressure being applied to the identified presently-pressed pressure sensitive key by measuring a capacitive discharge timer count of the capacitive plate of the presently-pressed pressure sensitive key.

12. The keyboard system of claim 11, where the pressure sensing interface circuitry is further configured to: provide multiple pre-defined levels of different alternative toggle rate frequency that correspond to different pre-defined capacitive discharge timer count ranges; monitor and reevaluate the timer count value of the presently-pressed pressure sensitive key and output an updated toggled digital output signal having a pre-defined toggle rate frequency that corresponds to one of the different pre-defined timer count ranges for as long as the presently-pressed pressure sensitive key remains pressed.

13. The keyboard system of claim 1, further comprising a keyboard device body that includes the one or more pressure sensitive keys and a plurality of digital keys within the keyboard device body, each of the digital keys being coupled to provide a single open/short digital output signal each time the digital key is pressed by a user.

14. The keyboard system of claim 13, wherein the pressure sensing interface circuitry is further configured for coupling to provide the separate alternating open/short on/off digital output signal corresponding to each given pressure sensitive analog key of the keyboard device body to a respective column/row intersection of a common legacy keyboard key matrix that corresponds to the given pressure sensitive key being currently pressed and to monitor and reevaluate the degree of pressure being applied to the presently-pressed pressure sensitive key and output an updated toggled digital output signal to the respective column/row intersection of the common legacy keyboard key matrix for as long as the presently pressed pressure sensitive key remains pressed; wherein each of the digital keys of the keyboard device body is further configured for coupling to provide the single open/short digital output signal to the same common legacy keyboard matrix that receives the alternating open/short on/off digital output signals from the pressure sensing interface circuitry; and wherein the legacy keyboard matrix is operably coupled to a legacy keyboard controller having no analog input circuitry.

15. The keyboard system of claim 1, wherein the pressure sensing interface circuitry coupled is further configured to provide the corresponding separate toggled alternating open and short on/off digital output signal corresponding to each given one of the pressure sensitive analog keys in a manner that emulates toggling of a conventional momentary off/on digital key and to monitor and reevaluate the degree of pressure being applied to the presently-pressed pressure sensitive key and outputting an updated toggled digital output signal for as long as the presently-pressed pressure sensitive key remains pressed and without requiring toggling of the given key to which pressure is being applied.

16. The keyboard system of claim 1, wherein the pressure sensing interface circuitry is further configured to continue: providing the corresponding separate toggled alternating open and short on/off digital output signal corresponding to each given one of the pressure sensitive analog keys and outputting the updated toggled digital output signal corresponding to each given one of the pressure sensitive analog keys for as long as each given one of the presently-pressed pressure sensitive keys remains pressed.

17. The keyboard system of claim 1, wherein the pressure sensing interface circuitry is further configured to:
continue providing the corresponding separate toggled alternating open and short on/off digital output signal corresponding to a first one of the pressure sensitive analog keys at a first alternating on/off frequency that is representative of a first amount of pressure being currently applied to the corresponding first one of the pressure sensitive keys; and
then in response to a change in pressure currently applied to the first one of the pressure sensitive analog keys to provide a corresponding separate toggled alternating open and short on/off digital output signal corresponding to the first one of the pressure sensitive analog keys at a second and different alternating on/off frequency that is representative of a second and different amount of pressure being currently applied to the corresponding first one of the pressure sensitive keys by monitoring and reevaluating the degree of pressure being applied to the presently pressed first one of the pressure sensitive keys and outputting an updated toggled digital output signal for as long as the presently-pressed first one of the pressure sensitive keys remains pressed.

18. The keyboard system of claim 1, where the pressure sensing interface circuitry is further configured to provide a corresponding separate toggled alternating open and short on/off digital output signal having an alternating toggle rate frequency of at least one of about 20 times/second, about 16 times/second, or about 8 times/second.

19. A method of accepting user input from a keyboard, comprising:
providing one or more pressure sensitive keys;
producing an analog output signal for each given one of the pressure sensitive keys when when the given one of the pressure sensitive keys is depressed by a user, the analog output signals being representative of the given amount of pressure being currently applied to the given pressure sensitive key by the user; and
providing a corresponding separate toggled alternating open and short (open/short) on/off digital output signal based upon the analog output signal by:
sensing in real time pressure applied to each given one of the pressure sensitive keys,
identifying a pressure sensitive key presently being pressed,
determining a degree of pressure being applied to the presently-pressed pressure sensitive key,
providing the separate toggled alternating open and short on/off digital output signal by toggling a digital output signal corresponding to the identity of the presently-pressed pressure sensitive key to emulate the action of a user's finger repeatedly pressing a conventional digital key with a rate that is relative to the pressure being applied to the presently-pressed pressure sensitive key, and
monitoring and reevaluating the degree of pressure being applied to the presently-pressed pressure sensitive key and outputting an updated toggled digital output signal for as long as the presently-pressed pressure sensitive key remains pressed;
where the alternating open and short (open/short) on/off digital output signal has a frequency alternating between on and off that is representative of the given amount of pressure being currently applied to the given pressure sensitive key by the user.

20. The method of claim 19, further comprising:
providing pressure-sensing digital output circuitry;
providing switching circuitry;
receiving the analog output signal from each given one of the pressure sensitive keys in the pressure-sensing digital output circuitry;
providing a separate alternating high and low (high/low) digital output signal from the pressure-sensing digital output circuitry, each separate alternating high/low digital output signal being based upon a corresponding received analog output signal and having an alternating high/low frequency alternating between high and low that is representative of pressure applied to each given corresponding one of the pressure sensitive keys; and
receiving each of the alternating high/low digital output signals in the switching circuitry; and
providing the separate alternating open/short digital output signal from the switching circuitry, each separate alternating open/short digital output signal having a frequency alternating between on and off that is representative of pressure applied to a corresponding given one of the pressure sensitive keys.

21. The method of claim 20, further comprising providing a keyboard device body that includes pressure sensing interface circuitry; providing an information handling system chassis that includes a legacy keyboard key matrix having column/row intersections coupled to a legacy keyboard controller having no analog input circuitry; mechanically coupling the keyboard device body as a drop-in keyboard to the information handling system chassis; and providing the separate alternating open/short on/off digital output signal corresponding to each given pressure sensitive key being currently pressed from the switching circuitry to a respective column/row intersection of the legacy keyboard key matrix that corresponds to the given pressure sensitive key being currently pressed and outputting the updated toggled digital output signal to the respective column/row intersection of the legacy keyboard key matrix for as long as the presently-pressed pressure sensitive key remains pressed.

22. The method of claim 21, wherein the information handling system is a notebook computer.

23. The method of claim 20, further comprising providing an information handling system chassis that includes a legacy keyboard key matrix having column/row intersections coupled to a legacy keyboard controller comprising a separate microcontroller having an I/O interface that interfaces with the legacy keyboard key matrix, the legacy keyboard controller having no analog input circuitry; providing the pressure-sensing interface circuitry as an integrated circuit including a microcontroller, the microcontroller having falling edge-triggered digital interrupt inputs for receiving the pressure sensitive analog signals from the pressure sensitive keys; providing the separate alternating open/short digital on/off output signal corresponding to each pressure sensitive key to the column/row intersection of the legacy keyboard key matrix that corresponds to the given pressure sensitive key being currently pressed; accommodating an open or short of corresponding column/row signals in the legacy keyboard key matrix in response to receiving the alternating open/short digital output signal corresponding to the given pressure sensitive key being currently pressed and outputting the updated toggled digital output signal that corresponds to the given pressure sensitive key being currently pressed for as long as the presently-pressed pressure sensitive key remains pressed.

24. The method of claim 19, further comprising processing each of the analog output signals from each given one of the pressure sensitive keys with a falling edge event driven interrupt.

25. The method of claim 19, wherein the plurality of pressure sensitive keys is each a key further configured to produce a variable capacitance analog signal when depressed by a user; and wherein the method further comprising producing a variable capacitance analog signal for each given one of the pressure sensitive keys when depressed by a user.

26. The method of claim 25, wherein the plurality of pressure sensitive keys each further comprises a flexible and conductive half-dome structure positioned underneath a keycap.

27. The method of claim 25, further comprising generating a count associated with the capacitance measurement of each given pressure sensitive key and being utilized to represent pressure applied to the given pressure sensitive key; and producing the separate alternating open/short digital output signal based upon the generated count having a frequency alternating between on and off that is representative of pressure applied to the corresponding given one of the pressure sensitive keys.

28. The method of claim 19, further comprising providing a keyboard device body that includes the one or more pressure sensitive keys and a plurality of digital keys within the keyboard device body; and providing a single open/short digital output signal from each given digital key each time the given digital key is pressed by a user.

29. The method of claim 28, further comprising:
providing the separate alternating open/short on/off digital output signal corresponding to each given pressure sensitive analog key of the keyboard device body from the pressure sensing interface circuitry to a respective column/row intersection of a common legacy keyboard key matrix that corresponds to the given pressure sensitive key being currently pressed and outputting the updated toggled digital output signal to the respective column/row intersection of the common legacy keyboard key matrix;
providing the single open/short digital output signal from each given digital key to the same common legacy keyboard matrix that receives the alternating open/short on/off digital output signals from the pressure sensing interface circuitry; and
providing respective output signals corresponding to each given respective one of the pressure sensitive analog keys and each given one of the respective digital keys from the common legacy keyboard key matrix to a legacy keyboard controller when the corresponding individual analog and digital keys are depressed by a user, the legacy keyboard controller having no analog input circuitry.

30. The method of claim 19, further comprising providing the corresponding separate toggled alternating open and short on/off digital output signal corresponding to each given one of the pressure sensitive analog keys being depressed by a user in a manner that emulates toggling of a conventional momentary off/on digital key without requiring the user to toggle the given key being depressed by the user.

31. The method of claim 19, further comprising continuing to: provide the corresponding separate toggled alternating open and short on/off digital output signal corresponding to each given one of the pressure sensitive analog keys and output the updated toggled digital output signal corresponding to each given one of the pressure sensitive analog keys for as long as each given one of the presently-pressed pressure sensitive keys remains pressed.

32. The method of claim 19, further comprising:
continuing to provide the corresponding separate toggled alternating open and short on/off digital output signal corresponding to a first one of the pressure sensitive analog keys at a first alternating on/off frequency that is representative of a first amount of pressure being currently applied to the corresponding first one of the pressure sensitive keys and to monitor and reevaluate the degree of pressure being applied to the presently-pressed first one of the pressure sensitive keys and output an updated toggled digital output signal for as long as the presently pressed first one of the pressure sensitive keys remains pressed;
producing a change in the analog output signal from the first one of the pressure sensitive keys in response to a change in the amount of pressure currently applied to the first one of the pressure sensitive keys by the user from the first pressure to a second and different pressure; and
in response to the change in pressure currently applied to the first one of the pressure sensitive analog keys by the user, providing a corresponding separate toggled alternating open and short on/off digital output signal corresponding to the first one of the pressure sensitive analog keys at a second and different alternating on/off frequency that is representative of a second and different amount of pressure being currently applied to the corresponding first one of the pressure sensitive keys by monitoring and reevaluating the degree of pressure being applied to the presently-pressed first one of the pressure sensitive keys and outputting an updated toggled digital output signal for as long as the presently-pressed first one of the pressure sensitive keys remains pressed.

* * * * *